(12) United States Patent
Lee et al.

(10) Patent No.: US 6,826,115 B2
(45) Date of Patent: Nov. 30, 2004

(54) CIRCUITS AND METHODS FOR PROVIDING PAGE MODE OPERATION IN SEMICONDUCTOR MEMORY DEVICE HAVING PARTIAL ACTIVATION ARCHITECTURE

(75) Inventors: Jung-Bae Lee, Yongin (KR); Yun-Sang Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/640,146

(22) Filed: Aug. 13, 2003

(65) Prior Publication Data
US 2004/0066700 A1 Apr. 8, 2004

(30) Foreign Application Priority Data
Oct. 7, 2002 (KR) ......................................... 2002-61042

(51) Int. Cl.⁷ ................................................ G11C 8/00
(52) U.S. Cl. .............................. 365/238.5; 365/189.07; 365/191
(58) Field of Search ........................... 365/189.07, 191, 365/203, 230.03, 238.5

(56) References Cited

U.S. PATENT DOCUMENTS

| | | | |
|---|---|---|---|
| 5,159,676 A | * 10/1992 | Wicklund et al. | 365/238.5 |
| 5,640,364 A | 6/1997 | Merritt et al. | 365/233.5 |
| 5,644,747 A | * 7/1997 | Kusuda | 365/189.07 |
| 5,729,504 A | 3/1998 | Cowles | 365/236 |
| 5,966,724 A | 10/1999 | Ryan | 711/105 |
| 6,108,243 A | 8/2000 | Suzuki et al. | 365/189.01 |
| 6,556,483 B2 | * 4/2003 | Ryan et al. | 365/189.07 |

* cited by examiner

Primary Examiner—Son Mai
(74) Attorney, Agent, or Firm—F. Chau & Associates LLC

(57) ABSTRACT

A semiconductor memory device having a partial activation framework, which provides an efficient page mode operation while operating in a partial activation mode. Control circuits and methods are provided to enable a page mode operation (for read and write data accesses) in a semiconductor memory device (such as a DRAM, FCRAM) having a partial activation framework, resulting in an improved data access speed when data is written/read from memory locations having the same wordline address. In one aspect, a method for accessing data in a memory device comprises activating a first wordline corresponding to a first address to perform a data access operation, receiving a second address after the first address, if the second address is the same as the first address, generating a page mode enable signal for maintaining an activated state of the first wordline corresponding to the first address while activating a second wordline corresponding to the second address, and deactivating the first and second wordlines in response to disabling of the page mode enable signal.

36 Claims, 11 Drawing Sheets

CIRCUITS AND METHODS FOR PROVIDING PAGE MODE OPERATION IN SEMICONDUCTOR MEMORY DEVICE HAVING PARTIAL ACTIVATION ARCHITECTURE

CROSS-REFERENCE TO RELATED APPLICATION

This application claims priority to Korean Patent Application No. 2002-61042, filed Oct. 7, 2002 in the Korean Intellectual Property Office, which is incorporated herein by reference.

TECHNICAL FIELD OF THE INVENTION

The present invention relates to circuits and methods for providing page mode operation in a semiconductor memory device having a partial activation architecture.

BACKGROUND

There is a continual demand for semiconductor devices such as DRAM (dynamic random access memory) devices, which provide fast and efficient memory access operations (read and write operations). But as the memory access speed of a DRAM increases, the power dissipation generally increases, which can pose serious problems. Therefore, when developing a semiconductor memory device, the operating speed and power dissipation is a trade-off relationship that is typically considered. Some techniques for controlling power dissipation while providing high-speed operation have focused on reducing the memory cell array currents. By way of example, semiconductor memory devices having a partial activation architecture have been developed, which enables one of a plurality of memory cell array blocks to be activated for performing a memory access operation in an activated memory block. One example of a semiconductor device having a partial activation structure is a FCRAM (fast cycle random access memory), which was developed by Fujitsu Ltd.

FIGS. 1A through 1C illustrate a hierarchical memory architecture of a semiconductor memory device according to the prior art, which enables partial activation of blocks of memory cells. As shown in FIG. 1A, a semiconductor memory device (10) includes a plurality of memory banks (10A, 10B, 10C, 10D). Each memory bank represents, for example, a logical unit of memory in a PC, and each bank may consist of one or more memory modules (e.g., DIMM (Dual In-line Memory Module), SIMM (Single In-Line Memory Module)). Each memory bank (10A, 10B, 10C, 10D) is further logically divided into a plurality of memory cell array blocks. For instance, as depicted in the exemplary embodiment of FIG. 1B, the memory bank (10A) comprises four memory cell array blocks (100a, 100b, 100c, 100d).

In addition, each memory cell array block (100a, 100b, 100c, 100d) is further logically divided into a plurality of sub-memory cell array blocks (or column blocks), wherein each sub-memory cell array block is controlled by associated control circuitry. For instance, as depicted in the exemplary embodiment of FIG. 1C, the memory cell array block (100a) comprises four sub-memory cell array blocks (101, 102, 103, 104). The memory cell array block (100a) further comprises a plurality of sub-wordline drivers (105, 106, 107, 108), wherein each sub-wordline driver is associated with one of the sub-memory cell array blocks (101, 102, 103, 104).

Each sub-wordline driver (105, 106, 107 and 108) activates a corresponding sub-wordline (WL1, WL2, WL3, WL4) of the corresponding column block. More specifically, wordlines of memory block (100a) are formed over the memory block (100a) using a global wordline framework, and such wordlines are activated by a row decoder based on an input row address (wordline address). The sub-wordlines are formed over corresponding column blocks and the sub-wordline drivers (105, 106, 107, 108) control activation of corresponding sub-wordlines. For example, in the exemplary embodiment of FIG. 1C, when a row address and a column block selection address are input to the memory device, a global wordline corresponding to the input row address is activated by a row decoder. Furthermore, the input column block selection address is used to activate one of the column blocks (101, 102, 103, 104), which causes a corresponding sub-wordline driver (105, 106, 107, 108) to activate a corresponding sub-wordline having the same address as the activated (global) wordline.

The memory framework depicted in FIGS. 1A–C is one example of a memory framework that can be used for providing a partial activation semiconductor memory device, such as an FCRAM, whereby one of the sub-memory cell array blocks (101, 102, 103, 104) can be activated using, for example, a column block address (CBA) to perform data access or refresh operations. For instance, in the exemplary embodiment of FIG. 1C, since the memory cell array block (100a) comprises four sub-memory blocks (101, 102, 103, 104), a two-bit CBA can be used to select one of the four column blocks (sub-memory blocks), although one of ordinary skill in the art readily will appreciate that the memory framework can be designed with more or less column blocks that are individually addressable by predetermined column block selection addresses.

To perform a memory access operation using the memory framework shown in FIGS. 1A–1C, one of the memory banks (10A, 10B, 10C, 10D) is initially selected in response to a predetermined bank address, and then a memory cell array block (100a, 100b, 100c, 100d) within the selected memory bank is selected in response to a predetermined address (e.g., row address or any other address depending on the addressing scheme). Then, a row address (RA) and column block selection address (CBA) are input to activate a global wordline (based on the decoding results of the input row address of the row decoder) and to activate a column block of the selected memory cell array block (based on the input CBA). Then, only the sub-wordline of the selected column block is activated (having the same address as the activated global wordline) by the corresponding sub-wordline driver.

For example, in the exemplary embodiment of FIG. 1C, when a column block selection address 00 is input, a sub-wordline WL1 corresponding to the first column block (101) is activated based on the input row address. When the column block selection address 01 is input, a sub-wordline WL2 corresponding to the second column block (102) is activated. When the column block selection address 10 is input, a sub-wordline WL3 corresponding to the third column block (103) is activated. When the column block selection address 11 is input, a sub-wordline WL4 corresponding to the fourth column block (104) is activated. Thus, only one-quarter of the memory cells having the same row address are activated. The data is then input/output to/from the activated column block depending on the input column line address(es). In addition, the sub-wordline of the activated column block is automatically inactivated, i.e., precharged, after a predetermined amount of time.

A FCRAM implements a partial activation mode to reduce current dissipation and to improve access speed. In a FCRAM, the tRAC (active restore time) and tRC (row precharge time) are 22 ns and 25 ns, respectively, which represents improvements for tRAC and tRC by 10% and 50%, respectively, as compared to conventional DRAMs.

There are some problems associated with operating a DRAM device in a partial activation mode as compared to a conventional DRAM. For example, it is difficult to perform a "page mode" operation for reading/writing data in a DRAM operating in a partial activation mode. As in known in the art, "page mode" generally denotes an operation mode in which data is input/output to/from a plurality of memory cells having the same row address X by changing only a column address Y, after the row address X is input once. Conventional DRAM devices operate in a "page mode" to provide increased memory access speed, while providing a reduction in the power consumption.

A page mode operation is difficult to implement in a DRAM that operates in a partial activation mode, because, as discussed above with reference to FIG. 1C, the memory cells connected to the same row address (global wordline address) are selectively activated/controlled based on the column block selection address, which is input with the row address. More specifically, when a DRAM having an n-bit column block selection address is operated in a partial activation mode, it is necessary to input the same row address a maximum number of $2^n$ times in order to input/output data to/from memory cells in all column blocks for the same row address. Indeed, with conventional designs, when a given row address is input with an active command signal ACT, the next address (and active command ACT) may only be input after a predetermined time, i.e., tRC, in the case of the FCRAM, because a row precharge operation is automatically performed after a predetermined time from the input of a row address. Therefore, with a FCRAM having an n-bit column block selection address, in order to input/output a data to/from memory cells having the same row address in all the column blocks, the memory access time is equal to a maximum time of $tRC \times 2^n$ plus the data input/output time. These concepts will now be explained by way of example with reference to FIGS. 1C and 2.

FIG. 2 is an exemplary timing diagram illustrating a memory access operation of a conventional semiconductor memory device having a partial activation framework as described above. More specifically, the example of FIG. 2 illustrates a read operation of a conventional semiconductor device having the partial activation structure as shown in FIG. 1C, wherein the read operation is performed using a burst mode where the burst length is 4. In the example of FIG. 2, each input row address X is assumed to be the same. Referring to FIG. 2, a first active command ACT and a row address X and column block selection address CB1 are input synchronously with a clock CLK signal at clock cycle C1. In response, the first column block (101) is selected by the column block selection address CB1 and the word line WL1 corresponding to the input row address X is activated in the first column block (101). When a reading command/RD and a column address Y are input at a subsequent clock cycle C2, one column corresponding to the column address Y is selected so that data is output from the memory cell located at the intersection of the activated word line WL1 and the selected column line. Since the burst length is 4, four data bits DQ are successively output according to one reading command/RD starting from the input column address, for example.

In the conventional design, a row precharge is automatically started after about three (3) cycles from the clock cycle C1 when the active command ACT is applied (i.e., row precharge starts at clock cycle C4). The activated sub-wordline WL1 is then inactivated in response to the commencement of the row precharge operation. A subsequent active command ACT and row address X and a column block selection address CB2 are input at a clock cycle C6 after the row precharge operation is ended. Since the row precharge is automatically started after a predetermined amount of time from the input of an active command ACT, a subsequent active command ACT can be applied only when the row precharge operation is ended. Here, the period of time from the input of an active command ACT to the input of a subsequent active command ACT is referred to as the tRC (row precharge time). In response to the row address X and the column block selection address CB2 input at the clock cycle C6, a corresponding word line WL2 in the second column block (102) is activated. Then, a row precharge is automatically started at clock cycle C9, which is three (3) clock cycles from the input of the active command ACT at clock cycle C6. Therefore, the subsequent active command ACT, row address X, and column block selection address CB3 can only be applied at clock cycle C11 when the precharge operation of the activated sub-wordline WL2 is ended. Accordingly, as described above, in a conventional DRAM device (such as a FCRAM) that automatically performs a precharge operation after a predetermined time from the input of a command, a subsequent row address can only be input after an amount of time tRC, even when the subsequent row address is the same as the previously input row address.

Therefore, although a conventional DRAM device (such as an FCRAM), in which an n-bit column block selection address allows selection of one of $2^n$ column blocks of memory in a partial activation mode of operation, can provide an improvement in the I/O speed of memory accesses when different row addresses are input, because the partial activation mode requires a precharge operation to be performed after a predetermined time from the input of the given row address (i.e., the input of an active command), when the same row address is input, the device may provide an I/O memory access speed that is slower than that of other conventional semiconductor memory devices (e.g., SDRAM, DDR DRAM).

Accordingly, it is desirable to provide circuits and methods that would provide an increase the I/O speed of memory accesses in a DRAM having a partial activation framework when memory accesses are performed for a previous and subsequent row address that are the same.

SUMMARY OF THE INVENTION

The present invention is directed to a semiconductor memory device having a partial activation framework, which provides an efficient page mode operation while operating in a partial activation mode. The present invention is further directed to control circuits and methods that enable a page mode operation (for read and write data accesses) in a semiconductor memory device (such as a DRAM, FCRAM) having a partial activation framework, resulting in an improved data access speed when data is written/read from memory locations having the same wordline address.

In one embodiment, a method for accessing data in a memory device comprises activating a first wordline corresponding to a first address to perform a data access operation, receiving a second address after the first address, if the second address is the same as the first address, generating a page mode enable signal for maintaining an activated state of the first wordline corresponding to the first address while activating a second wordline corresponding to the second address, and deactivating the first and second wordlines in response to disabling of the page mode enable signal.

In another embodiment, a semiconductor memory device comprises a memory cell array comprising a plurality of memory blocks, a command decoder for decoding command signals and outputting decoded command signals to perform a data access operation, an address comparator for comparing a first address corresponding to an activated first wordline to a second address received after the first address, and generating a page mode enable signal if the first address and the second address are the same, and a precharge control circuit for controlling a precharge operation, wherein the precharge control circuit is responsive to the page mode enable signal to prevent a precharge operation of the activated first wordline while a second wordline corresponding to the second address is activated to perform a data access operation.

Preferably, the memory cell array comprises a partial activation framework, wherein each memory block is individually addressable by a block address. A data access operation comprises a page mode operation where data is accessed for one or more memory cells having the same row address in a same memory block or in a different memory block. Data can be accessed using a burst mode of operation.

In yet another embodiment, the address comparator comprises means for storing the first address, means for comparing the second address to the first address to determine if the first and second address are the same, and means for outputting the page mode enable signal from the comparator if the first and second address are the same.

In another embodiment, the semiconductor memory device comprises a command shifter circuit, operatively connected to an output of the command decoder and address comparator, wherein in response to the page mode enable signal output from the address comparator, the command shifter delays a write command signal output from the command decoder by a predetermined first delay time. In one embodiment, the command shifter circuit comprises a clock shifter for delaying the write command signal, the clock shifter comprising a plurality of serially connected inverters. In another embodiment, the command shifter circuit comprises a clock shifter for delaying the write command signal, the clock shifter comprising a plurality of serially connected flip-flops.

In yet another embodiment, in response to the write command signal, the precharge control circuit delays the page mode enable signal by a predetermined second delay time to generate a delayed page mode enable signal. The delayed page mode enable signal prevents a precharge operation of activated wordlines.

These and other embodiments, aspects, features and advantages of the present invention will be described and become apparent from the following detailed description of preferred embodiments, which is to be read in connection with the accompanying drawings.

DETAILED DESCRIPTION OF PREFERRED EMBODIMENTS

The present invention is directed to a semiconductor memory device that provides an efficient page mode operation in a partial activation operation mode. More specifically, circuits and methods according to preferred embodiments of the present invention are based on addressing schemes and control circuitry which provide an improved page mode operation and increase in the data access speed of a semiconductor memory device (such as a DRAM, FCRAM) having a partial activation framework.

Figure 1A:
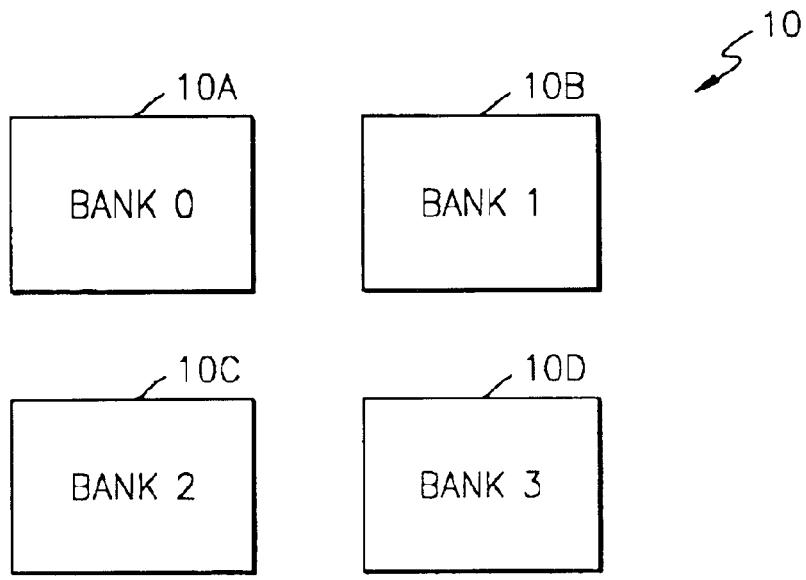
FIGS. 1A through 1C illustrate a hierarchical memory architecture of a semiconductor memory device according to the prior art, which enables partial activation of blocks of memory cells.
Figure 1B:
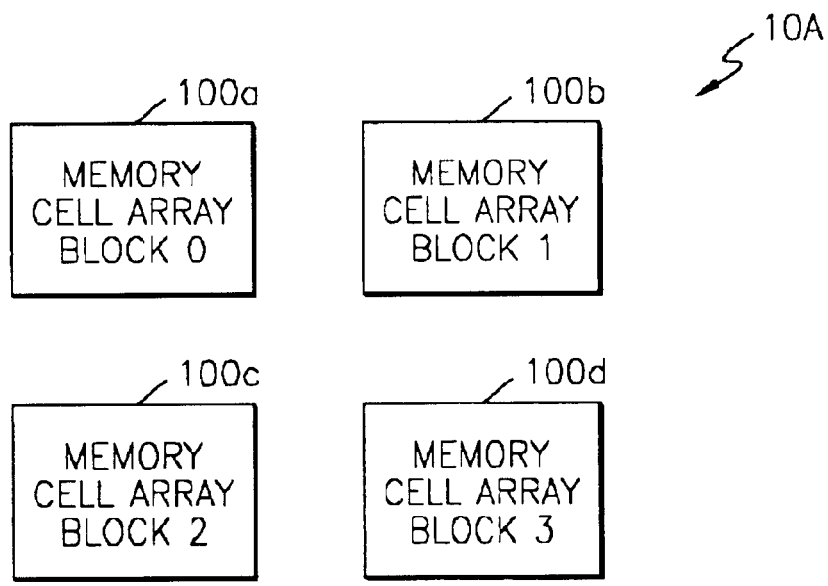
Figure 1C:
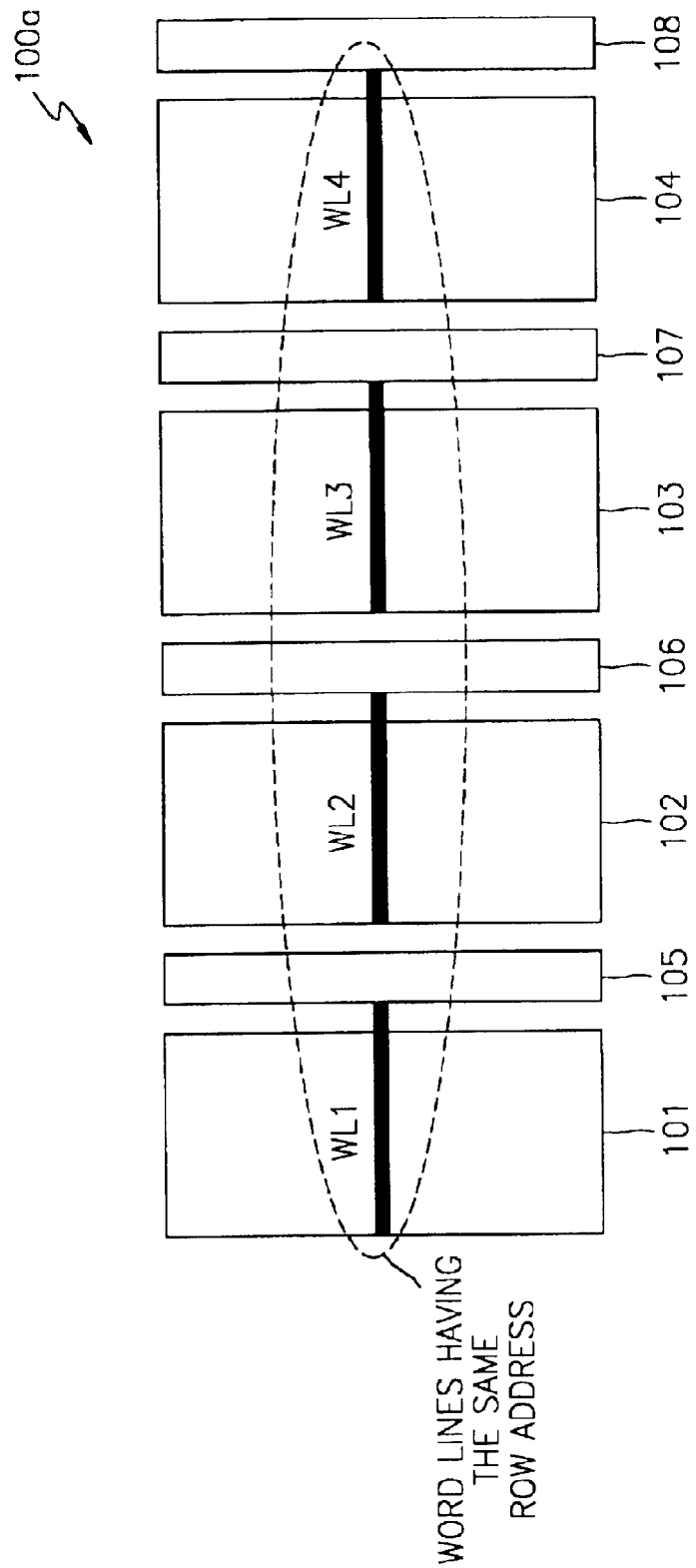
Figure 3:
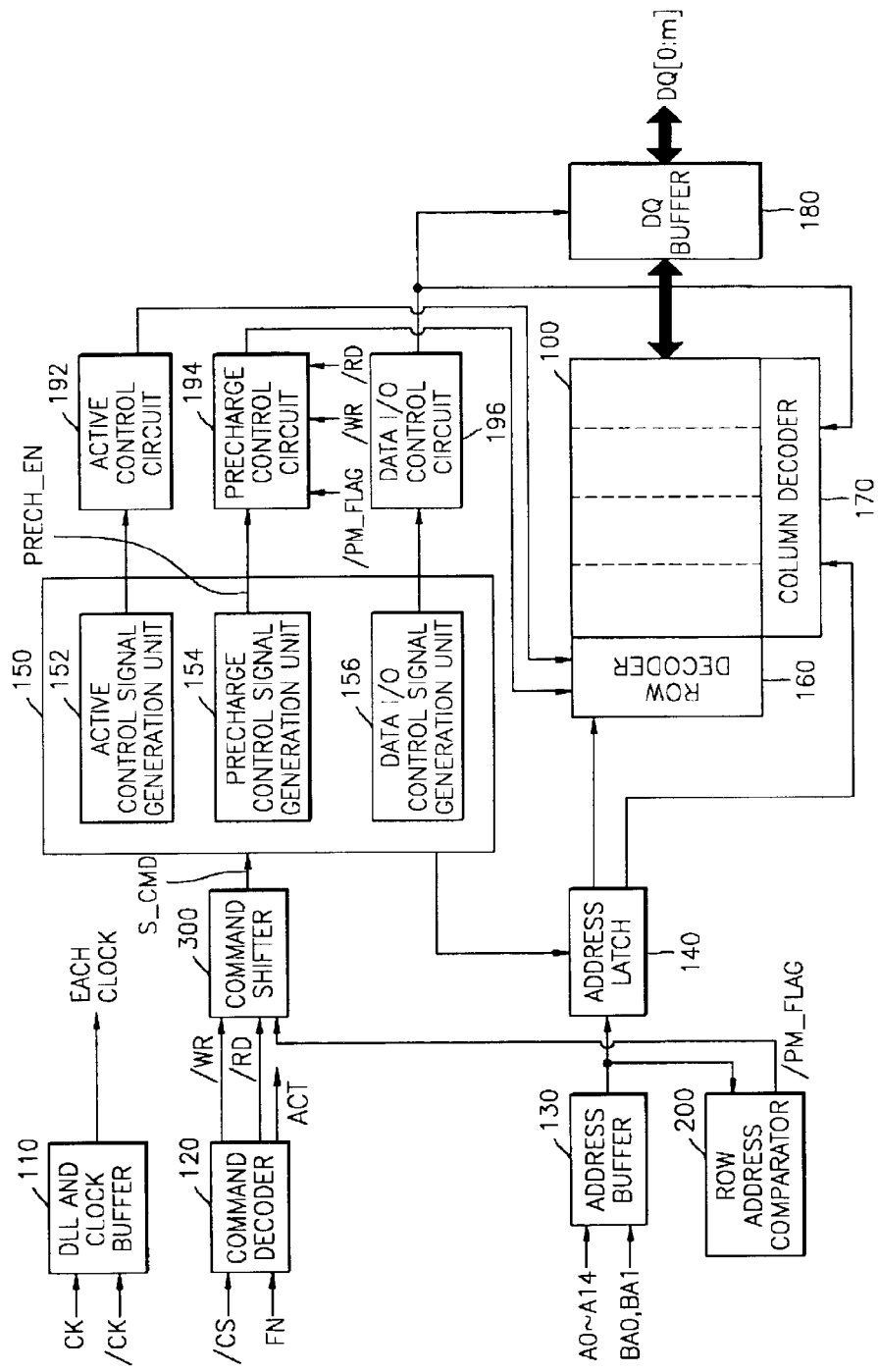
FIG. 3 schematically illustrates a semiconductor memory device having a partial activation framework according to one embodiment of the present invention, which provides an efficient page mode operation in a partial activation mode of operation.

FIG. 3 is a block diagram illustrating a semiconductor memory device having a partial activation framework according to an embodiment of the present invention, which provides an efficient page mode operation in a partial activation mode of operation. Referring to FIG. 3, a semiconductor memory device comprises a memory cell array (100), a plurality of peripheral circuits (110 through 196) for inputting/outputting data into/from the memory cell array (100), a row address comparator (200), and a command shifter (300). For illustrative purposes, it is assumed throughout the following discussion that the memory cell array (100) comprises an array structure as discussed above with reference to FIGS. 1A, 1B and 1C. For example, it is assumed that the memory cell array (100) illustrates one memory block of one memory bank and is divided into four column blocks (101, 102, 103, 104), which are addressable by a 2-bit CBA, for performing partial activation mode of operation as discussed above. Those of ordinary skill in the art will readily appreciate that other the present invention may be implemented in with other memory frameworks.

Clock signals CK and /CK are transmitted to each of the functional blocks of the semiconductor memory device via the delay-locked loop (DLL) and clock buffer circuit (110) for synchronizing operations. A command decoder (120) receives external command signals /CS and FN (from a memory controller and/or CPU) and decodes the command signals /CS and FN to generate commands, such as an active command ACT, a reading command /RD, and a writing command /WR. The active command ACT is processed by various circuits, such as a control signal generator (150). The reading and writing commands generated by the command decoder (120) are processed by a command shifter (300) which generates a control signal S_CMD to the control signal generator (150), in response to the reading command /RD, writing command /WR and a page mode flag signal (/PN_FLAG) generated by a row address comparator (200).

As described below in further detail below with reference to FIGS. 5 and 6, for example, in a page mode operation according to the present invention where data is successively written to memory locations having the same row address in the same or different column blocks (101, 102, 103, 104), the command shifter (300) will delay the write command/WR by a predetermined time TD1 to account for write latency and delay activation of one or more wordlines having the same row address, to thereby secure the operation and precharge for a previously activated wordline having a different row address.

The control signal generator (150) comprises an active control signal generation unit (152), a precharge control signal generation unit (154), and a data input/output control signal generation unit (156), for generating control signals that control memory access operations. More specifically, the active control signal generation unit (152) outputs a control signal to an active control circuit (192) to control an active memory access operation. The precharge control signal generation unit (154) outputs a control signal including a precharge enable signal PRECH_EN to a precharge control circuit (194) to control a precharge operation. The data input/output control signal generation unit (156) outputs a control signal to a data input/output control circuit (196) to control data input/output operations of the DQ buffer (180).

A plurality of address signals (A0, A1, . . . A14) and bank address signals (BA0 and BA1), which are externally received from a memory controller or CPU, for example, are input to a row decoder (160) and a column decoder (170), respectively, via an address buffer (130) and an address latch (140). The address latch (140) operates under the control of the control signal generator (150). The row decoder (160), which comprises wordline driver circuitry, decodes an input row address X and selects and actives a corresponding row line (or global word line) of the memory cell array (100). The column decoder (170) decodes an input column address Y and selects a column line in the memory cell array (100) corresponding to the address Y for inputting or outputting data. The data to be written to memory is first input through data input/output pins DQ[0:m] and stored in a data DQ buffer (180). Data that is read out from the memory cell array (100) is first stored in the data DQ buffer (180) and then output through the input/output pins DQ[0:m].

In accordance with the present invention, an externally applied row address signal is input to the row address comparator (200), as well as the row decoder (160), via the address buffer (130). The row address comparator (200) compares a presently input row address (hereafter, referred to as "current" row address) to a stored row address (hereafter, referred to as a "previous" row address). Here, the "current" row address denotes a presently input row address and the "previous" row address denotes the row address that was input just prior to the current row address.

When the "current" and "previous" row addresses are determined to be the same, the row address comparator (200) generates a page mode flag signal (/PM_FLAG), which is output to the command shifter (300) and the precharge control circuit (194). The page mode flag signal (/PM_FLAG) triggers a "page mode" memory access operation (for either a read or write operation, as specified by the /WR or /RD).

In response to the page mode flag signal (/PM_FLAG), the precharge control circuit (194) will block a precharge operation for the wordline that was activated in response to the previous row address. More specifically, the precharge control circuit (194) controls the precharge operation in response to the page mode flag signal /PM_FLAG output from the row address comparator (200), as well as the precharge enable signal PRECH_EN output from the precharge control signal generation unit (154). In response to the page mode flag signal (/PM_FLAG), the precharge control circuit (194) will disable a precharge control signal /PRECH-CS) even when the precharge enable signal (PRECH_EN) is enabled, to prevent a precharge operation.

Therefore, when a "current" row address (which is the same of the "previous" row address) is input before the activated column block (which was activated in response to the previous address) is precharged, the precharge operation for the activated wordline of the previously activated column block is postponed to the next precharge timing corresponding to a next subsequent row address. It is to be understood that the same row address may be successively input 3 or more times, in which case, the precharge operation will be postponed until a different row address is input.

On the other hand, when a "current" address is different from a previous row addresses (as determined based on the comparison result of the row address comparator (200)), a previously activated wordline of a previous column block, which was activated by the previous row address, is automatically precharged after a predetermined amount of time from the input/output of data.

Therefore, in accordance with the present invention, a page mode can be realized by inputting the same row address before the start of the precharge in response to the previous active command ACT. In other words, since the activation period of the selected column block is extended by applying the same row address, a page mode function is effectively obtained whereby data can be successively input/output data to/from a plurality of columns having the same row address. Accordingly, a page mode operation for the memory cells having the same row address is possible.

It is to be understood that the above process of blocking the precharge operation is performed when either data is read or written to memory during a page mode operation. But in addition to blocking the precharge operation, the control circuitry of FIG. 3 performs additional functions when data is written to memory in a page mode operation. For instance, in response to the page mode flag signal (/PM_FLAG), the command shifter (300) will effectively delay the writing command /WR by a predetermined amount of time TD1, to delay the out put of control signal S_CMD, to account for write latency and delay activation of one or more wordlines having the same row address, and thereby secure the operation and precharge for a previously activated wordline having a different row address. In addition, the output of the delayed signal S_CMD causes the output of the precharge enable signal (PRECH_EN) to be delayed. In addition, the precharge control circuit (194) will delay the output of the page mode flag signal (/PM_FLAG) by a predetermined amount of time TD2 to account for the delay TD1 in activating the wordlines.

Exemplary page mode memory access operations (read and write operations) according to the present invention will now be explained in further detail with reference to the exemplary timing diagrams of FIGS. 4 and 5, for example.

Figure 4:
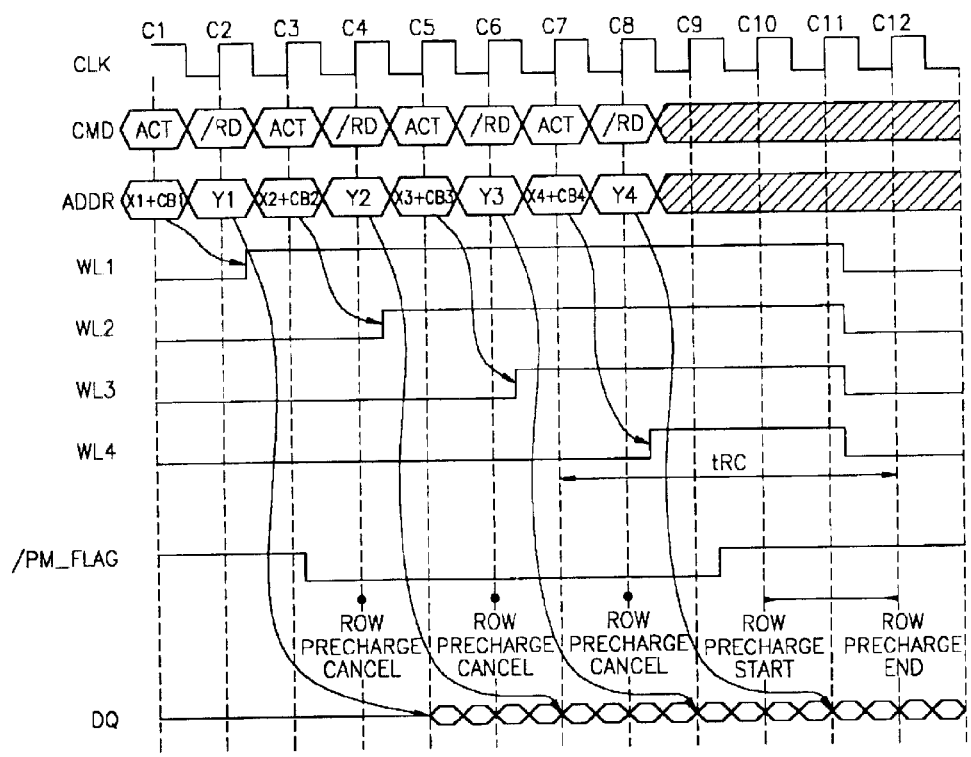
FIG. 4 is an exemplary timing diagram illustrating a memory access operation according to one embodiment of the present invention, which is implemented in a semiconductor memory device having a partial activation framework.

FIG. 4 is an exemplary timing diagram illustrating a memory access operation according to one embodiment of the present invention, which is implemented in a semiconductor memory device having a partial activation framework. More specifically, FIG. 4 illustrates a "page mode" operation of the semiconductor memory device of FIG. 3, wherein data is read from memory cells having the same row address in each column block (101, 102, 103 and 104) of the memory (100). In the example of FIG. 4, it is assumed that a burst length is four (4) and that row addresses X1, X2, X3, and X4, which are input with four active commands ACT, are the same.

In the exemplary "page mode" operation of FIG. 4, the active commands ACT and read commands /RD may be successively input without delay (which is in contrast to the method of FIG. 2) because the page mode flag signal /PM_FLAG is enabled (active low) to prevent the row precharge operation from being performed when the input row addresses (X1, X2, X3, X4) are the same. More specifically, in the conventional method of FIG. 2 as explained above, a row precharge operation is automatically performed 3 clock cycles after the input of an active command ACT. However, in the exemplary method depicted in FIG. 4, the row precharge operations that would normally occur 3 cycles after the input of the active commands ACT in clock cycles C1, C3, and C5 (i.e., the row precharge operations in C4, C6 and C8) are canceled in response to the page mode enable signal /PM_FLAG. Therefore, during the page mode operation, the wordlines having the same row address are maintained active until the page mode flag signal is disabled.

The exemplary page mode operation depicted in FIG. 4 will now be explained in further detail with reference to FIGS. 3 and 4. In FIG. 4, an active command ACT and a row address X1 and a column block selection address CB1 are synchronously input in clock cycle C1. The first column block (101) (FIG. 3) is selected in response to the column block address CB1 and the sub-wordline WL1 (of the global wordline) corresponding to the input row address X1 is activated in response to the input row address X1. In clock cycle C2, a read command /RD and a column address Y1 is input. In response, a column corresponding to the column address Y1 is selected and then after 3 clock cycles, data is read starting from the memory cell that is located at the intersection of the activated sub-wordline WL1 and the selected column line corresponding to address Y1, Here, since the burst length is four, four data bits DQ are successively output (from the buffer (180)) in response to one reading command /RD, starting in clock cycle C5.

Then, an active command ACT and a row address X2 and a column block selection address CB2 are subsequently input in clock cycle C3. The second column block (102) is activated in response to the address CB2. In addition, the corresponding sub-wordline WL2 of the second clock block (102) is activated based on the input address X2. More specifically, with reference to FIG. 3, the current row address X2 is input to the row address comparator (200) via the address buffer (130). The row address comparator (200) compares the current input row address X2 to the previous row address X1. Since row addresses X1 and X2 are the same, the row address comparator (200) generates the page mode flag signal /PM_FLAG having a "low" logic level for blocking the precharge of the previously activated sub-wordline WL1. As shown in FIG. 4, the page mode flag signal causes the row precharge operation, which would normally occur in clock cycle C4 in response to the input ACT command in clock cycle C1, to be cancelled. Accordingly, the precharge of the sub-wordline WL1 (and consequently, the corresponding activated global wordline) is postponed and the activation state of the sub-wordline WL1 is maintained while the second sub-wordline WL2 is activated.

Then, in response to the read command /RD and a column address Y2 that are subsequently input during clock cycle C4, data is read starting from the memory cell that is located at the intersection of the activated sub-wordline WL2 and the selected column line corresponding to column address Y2. Here, since the burst length is four, four data bits DQ are successively output (from the buffer (180)) in response to the reading command /RD, starting in clock cycle C7.

Thereafter, when a third active command ACT and a current row address X3 (which is the same as the previous row address X2) and a column block selection address CB3 are input at a clock cycle C5, an operation similar to the above-described operation is performed. In particular, the row address comparator (200) determines that the current address X3 and the previous address X2 are the same and, consequently, the page mode flag signal /PM_FLAG remains enabled (logic "low" level). As such, the row precharge operation that would have normally occurred in clock cycle C6 in response to the second input ACT command in clock cycle C3 is cancelled. Accordingly, the precharge of the sub-wordlines WL1 and WL2 (and consequently, the corresponding activated global wordline) is postponed and the activation state of the sub-wordlines WL1 and WL2 are maintained while the third-sub-wordline WL3 is activated.

Then, in response to the read command /RD and a column address Y3 that are subsequently input during clock cycle C6, data is read starting from the memory cell that is located at the intersection of the activated sub-wordline WL3 and the selected column line corresponding to column address Y3. Here, since the burst length is four, four data bits DQ are successively output (from the buffer (180)) in response to the reading command /RD, starting in clock cycle C9.

Similarly, when a fourth active command ACT and a current row address X4 (which is the same as the previous row address X3) and a column block selection address CB4 are input at a clock cycle C7, the row address comparator (200) determines that the current address X4 and the previous address X3 are the same and, consequently, the page mode flag signal /PM_FLAG remains enabled (logic "low" level). Accordingly, the precharge of the sub-wordlines WL1, WL2 and WL3 (and consequently, the corresponding activated global wordline) is postponed and the activation state of the sub-wordlines WL1, WL2, and WL3 are maintained while the sub-wordline WL4 is activated.

Then, in response to the read command /RD and a column address Y4 that are subsequently input during clock cycle C8, data is read starting from the memory cell that is located at the intersection of the activated sub-wordline WL4 and the selected column line corresponding to column address Y4. Here, since the burst length is four, four data bits DQ are successively output (from the buffer (180)) in response to the reading command /RD, starting in clock cycle C11.

As depicted in FIG. 4, an active command is not input at clock cycle C9. Thus, the row address comparator (200)

determines that the current row address is different from the previous row address X4, thereby disabling the page mode flag signal /PM_FLAG (e.g., outputting a logic "high" level). In response to disabling the page mode flag signal, a precharge operation will automatically begin in clock cycle C10 in response to the fourth input ACT command in clock cycle C7. In such case, the precharge control circuit (194) (FIG. 3) will precharge all of the activated word lines WL1, WL2, WL3, and WL4.

Accordingly, in a page mode operation according to the invention where data is read from memory, if a current row address and a previous row address are determined to be the same, a page mode flag signal /PM_FLAG will be enabled to prevent a precharge operation, which causes a previously activated wordline (which was activated in response to the previous row address) to remain in an activated state. As such, data in memory cells having the same row address can be continuously read out from either the same column block or different column blocks, which provides an increase in the memory access speed in a partial activation mode of operation. Indeed, as shown in FIG. 4, data bits DQ can be continually output in successive clock cycles C5–C12.

Figure 2:
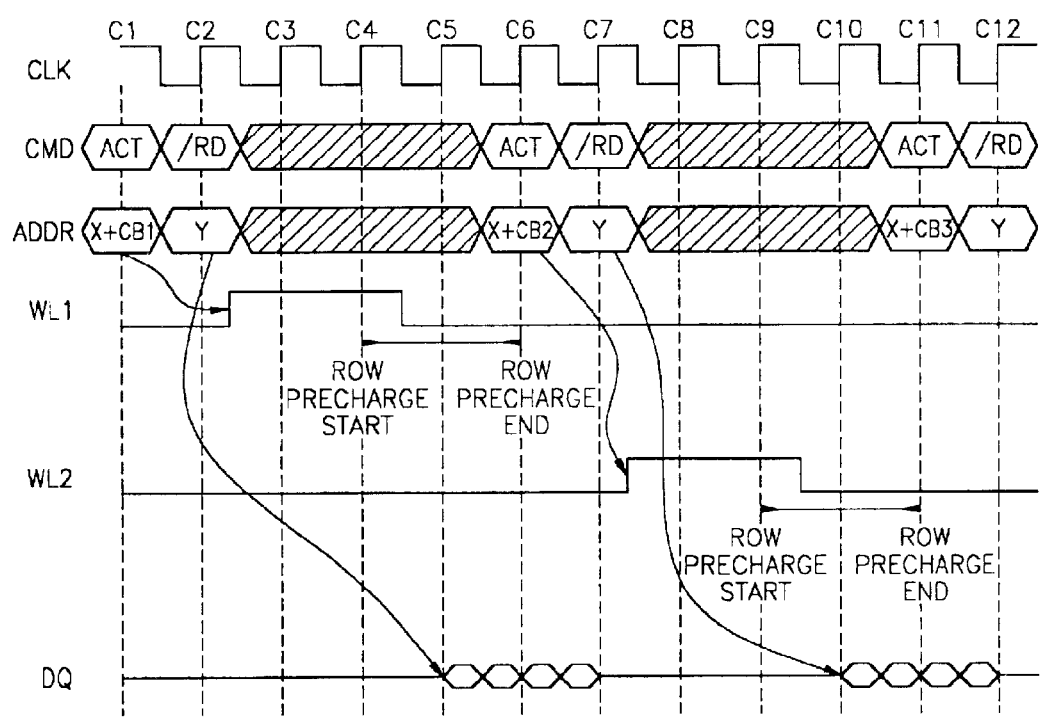
FIG. 2 is an exemplary timing diagram illustrating a conventional memory access operation of a conventional semiconductor memory device having a partial activation framework.

This is to be contrasted with a read operation of a conventional semiconductor memory device as explained above with reference to FIG. 2. In the conventional operation, even when a current and a previous row addresses are the same, the current row address must be input after a predetermined amount of time tRC, which reduces the input/output speed when reading memory cells having the same row address in partial activation mode of operation. Indeed, as shown in FIG. 2, even though the same row addresses X are successively input, the data output is not continuous, whereas in FIG. 4, the data output is continuous when the input row addresses are the same.

Figure 5:
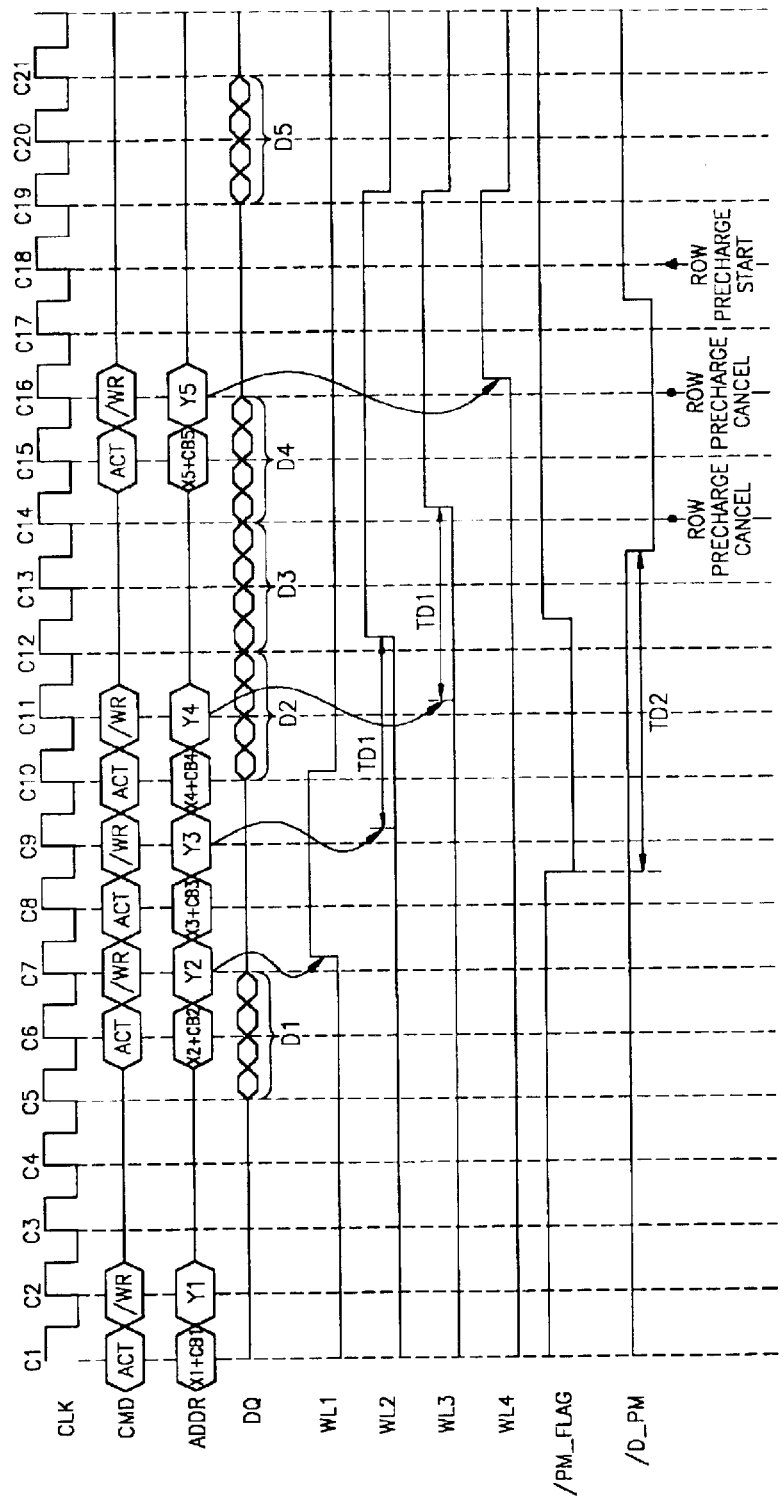
FIG. 5 is an exemplary timing diagram illustrating a memory access operation according to another embodiment of the present invention, which is implemented in a semiconductor memory device having a partial activation framework.

FIG. 5 is an exemplary timing diagram illustrating a memory access operation according to another embodiment of the present invention, which is implemented in a semiconductor memory device having a partial activation framework. More specifically, FIG. 5 illustrates a "page mode" operation wherein data is written to memory cells having the same row address. In general, in a page mode operation where data is written to memory cells having the same row address in either the same or different column blocks, in addition to the row precharge being canceled as described above during the page mode operation, the activation of the wordlines and the output of the page mode flag signal are delayed for certain predetermined amounts of time to account for a write latency associated with a memory access operation. More specifically, when a writing command is received, an address and data corresponding to the writing command are first stored in a writing buffer. Thereafter, when a subsequent writing command for the same bank is received, the data of the writing buffer is written in a memory cell corresponding to the address that is stored in the writing buffer. Thus, a word line corresponding to the row address, which is input with the writing command, is not promptly activated but activated after the subsequent writing command is applied.

The exemplary page mode operation depicted in FIG. 5 will now be explained in further detail with reference to FIGS. 3 and 5. In FIG. 5, it is assumed that row addresses X2, X3, and X4 are the same while, but are different from the row addresses X1 and X5, and that a burst writing operation is performed with a burst length of 4. As with a page mode operation for reading data from memory (as discussed above with reference to FIG. 4), the time intervals for applying the active commands ACT are reduced when performing a page mode operation for writing data to memory, as compared to the time intervals in which the active commands ACT are applied during a normal mode (non-page mode).

Referring to FIG. 5, an active command ACT and a row address X1 and column block selection address CB1 are input synchronously with clock cycle C1. Thereafter, a writing command /WR and a column address Y1 are input at a subsequent clock cycle C2 and after three clock cycles from the input of the column address Y1 four data bits D1 are successively input and stored to a writing buffer (not shown) located in the DQ buffer (180) during two clock cycles.

In clock cycle C6, another active command ACT is received and a row address X2 and a column block selection address CB2 are input. The row address X2 is input to the row address comparator (200) via the address buffer (130) and the row address comparator (200) compares the current input row address X2 with the previous row address X1. Since the row addresses X1 and X2 are different, the row address comparator (200) will maintain the page mode flag signal /PM_FLAG at a "high" logic level. Accordingly, the page mode flag signal remains disabled and a page mode operation is not triggered.

Then, a writing command /WR and a column address Y2 are input at a subsequent clock cycle C7. Accordingly, in response to the second writing command /WR, and based on the row address X1 and the column block selection address CB1 that are stored in the writing buffer, a corresponding sub-wordline WL1 of the first column block (101) is activated. A column corresponding to the column address Y1 is selected so that the data D1 stored in the writing buffer are input starting at the memory cell located at the intersection of the activated sub-wordline WL1 and the selected column line corresponding to column address Y1. In addition, since the page mode operation has not been activated, the previously activated sub-wordline WL1 is precharged.

Then, in clock cycle C8, another active command ACT is received and a row address X3 and a column block selection address CB3 are input. The row address comparator (200) compares the current row address X3 with the previous row address X2. Since the row addresses X2 and X3 are the same, the row address comparator (200) generates a page mode flag signal /PM_FLAG having a logic "low" level (i.e., the page mode flag signal in enabled), thereby activating a page mode operation. However, the page mode flag signal /PM_FLAG is output as a delayed page mode flag signal /D_PM, with a delay of TD2, for reasons explained in detail below.

At a subsequent clock cycle C9, the writing command /WR and a column address Y3 are input. Thus, in response to the writing command/WR, and based on the row address X2 and the column block selection address CB2 that are in the writing buffer, a corresponding sub-wordline WL2 of the second column block (102) should be activated. However, in order to sufficiently secure the operation for the previously activated sub-wordline WL1, the activation of the sub-wordline WL2 is delayed for a predetermined first delay time TD1, as shown in FIG. 5. Indeed, since the time intervals for applying the active commands ACT are reduced in the page mode operation (as compared to non-page mode operation), the activation of the subsequent sub-wordline WL2 is delayed to secure the operation and precharge of the previously activated sub-wordline WL1.

In principle, the sub-wordline WL2 should be activated after the input (in clock cycle C9) of the writing command /WR and the column address Y3 (as was the sub-wordline WL1 after the column address Y2 was input in clock cycle C7). However, since the ACT commands are received in shorter time intervals during the page mode operation, the operation time for the sub-wordline WL1 would not be sufficiently secured if the sub-wordline WL2 was activated at such time, without delay. Therefore, in the exemplary embodiment of FIG. 5, the activation of the sub-wordline WL2 is preferably delayed for about three clock cycles after input of the writing command /WR and column address Y3. After the sub-wordline WL2 is activated, the buffered data D2 is written to memory starting from the memory location corresponding to the intersection of the sub-wordline WL2 and the selected column line corresponding to Y2.

Furthermore, since the activation of the sub-wordline WL2 is delayed, the output of the enabled page mode flag signal /PM_FLAG (which postpones the row precharge operation for the activated sub-wordline WL2 and subsequently activated sub-wordlines (having the same row address) for the page mode operation) is also delayed by a predetermined time TD2. More specifically, in a page mode operation where data is written to memory, the precharge control circuit (194) controls the precharge of the word line in response to a delayed page mode flag signal /D_PM, which is generated by delaying the page mode flag signal /PM_FLAG for predetermined number of clock cycles, i.e., a second delay time TD2 as shown in FIG. 5. Therefore, the precharge for the sub-wordline WL2 is postponed and the sub-wordline WL2 is maintained active.

Next, in clock cycle C10, an active command ACT and a row address X4 and column block selection address CB4 are input, and an operation similar to the above-described operation is performed, because the row address X4 is the same as the previous row address X3.

An active command ACT is not applied in clock cycle C12. Therefore, the row address comparator (200) determines that the current row address is different from the previous row address X4 and, in response, disables the page mode flag signal /PM_FLAG (e.g., generates a page mode flag signal having a logic "high" level). Accordingly, in response to the delayed page mode flag signal /D_PM having a logic "high" level, the precharge control circuit (194) initiates a precharge operation in clock cycle C18 to precharge the activated sub-wordlines WL2, WL3, and WL4 at the same time.

Therefore, the exemplary method of FIG. 5 enables data to be written to memory in a page mode operation. As described above, since a writing operation is performed after a subsequent writing command is input, a page mode operation causes a subsequent sub-wordline to be delayed by a first delay time TD1 to secure the operation time for a previously activated sub-wordline. Since the activation of the sub-wordline is delayed, the page mode flag signal, which blocks the precharge operation of the activated sub-wordlines, is also delayed in the page mode. It is to be understood that in a page mode operation, when a previous row address and a current row address are the same, data can be continuously written in memory cells having the same row address in either different column blocks or in the same column block, by maintaining the state of the previously activated wordline (s) corresponding to the same row address.

Figure 6:
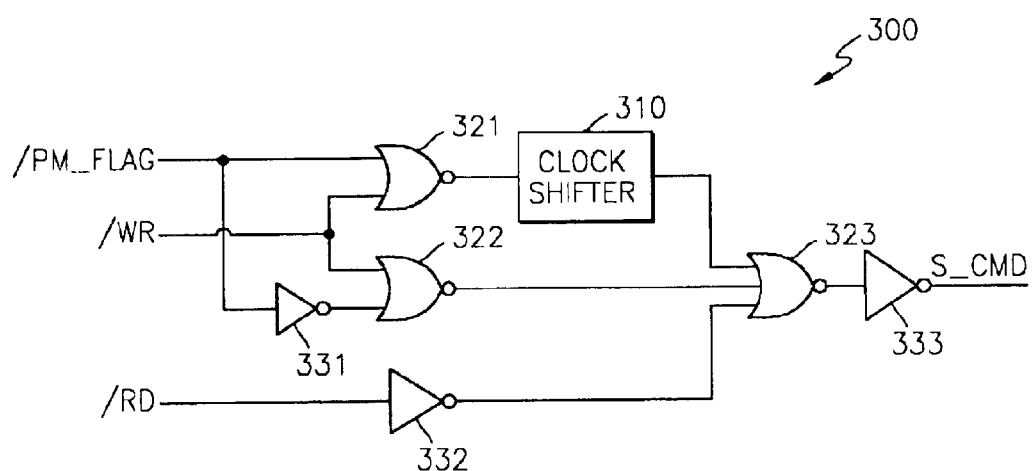
FIG. 6 is a circuit diagram illustrating a command shifter according to an embodiment of the present invention, which is preferably implemented in the device of FIG. 3.

FIG. 6 is a circuit diagram illustrating a command shifter (300) according to an embodiment of the present invention, which is preferably implemented in the device of FIG. 3. In general, in a page mode operation where data is written to memory, the command shifter (300) will delay the write command /WR by a predetermined time TD1 so that the corresponding wordline will be delayed by TD1 (as shown in FIG. 5). In the exemplary embodiment, the write command /WR will be delayed only when the page mode flag signal /PM_FLAG is enabled (logic low).

Referring now to FIG. 6, the command shifter (300) comprises a clock shifter (310), NOR gates (321, 322, 323) and inverters (331, 332, 333). It is assumed that the page mode flag signal /PM_FLAG, the writing command /WR, and the reading command /RD are signals that are activated at logic "low" levels.

The NOR gate (321) receives as input the writing command /WR and the page mode flag signal /PM_FLAG and performs a logical NOR operation on the input signals. The NOR gate (322) receives as input the writing command /WR and an inverted page mode flag signal /PM_FLAG (which is inverted by inverter (331)) and performs a logical NOR operation on the input signals. The clock shifter (310) delays an output signal of the NOR gate (321) by the first delay time TD1 (FIG. 5). The combination of the NOR gate (323) and the inverter (333) effectively perform a logical "OR" operation on the signals output from the clock shifter (310), the NOR gate (322), and the inverter (332), and the result of such "OR" operation is output as a command S_CMD.

With the command shifter (300) of FIG. 6, when the page mode flag signal /PM_FLAG and writing command signal /WR are enabled (i.e., logic "low" levels) and the read command signal /RD is disabled (logic "high" level), the outputs of the NOR gate (322) and inverter (332) will be logic low and the output of the NOR gate (321) will be logic "high". However, the output of the NOR gate (321) is delayed by the predetermined time TD1, which delays the generation of the S_CMD signal of logic "high" level for the predetermined time TD1, Therefore, in effect, the writing command /WR is delayed by the clock shifter (310) by the first delay time TD1.

When the page mode flag signal /PM_FLAG and reading command signal /RD are both disabled (logic high) and the writing command signal /WR is enabled (logic low), the output of the NOR gate (321) and the inverter (332) will be logic low, whereas the output of the NOR gate (322) will be logic high, and a non-delayed S_CMD signal having a logic high level will be generated. Therefore, in effect, the writing command /WR is not delayed when operating in non-page mode.

On the other hand, in a read operation when the reading command /RD is enabled (logic low), a non-delayed S_CMD signal having a logic "high" level will be output, regardless of the logic level of the page mode flag signal /PM_FLAG (i.e., regardless of whether the memory is operating in a page mode or non-page mode).

It is to be appreciated that the clock shifter may comprise any suitable circuit for delaying a signal. For instance, the clock shifter may comprise a plurality of serially connected inverters. Alternatively, the clock shifter may comprise a plurality of serially connected flip-flops. Those of ordinary skill in the art may readily envision other methods for implementing the clock shifter circuit.

Figure 7:
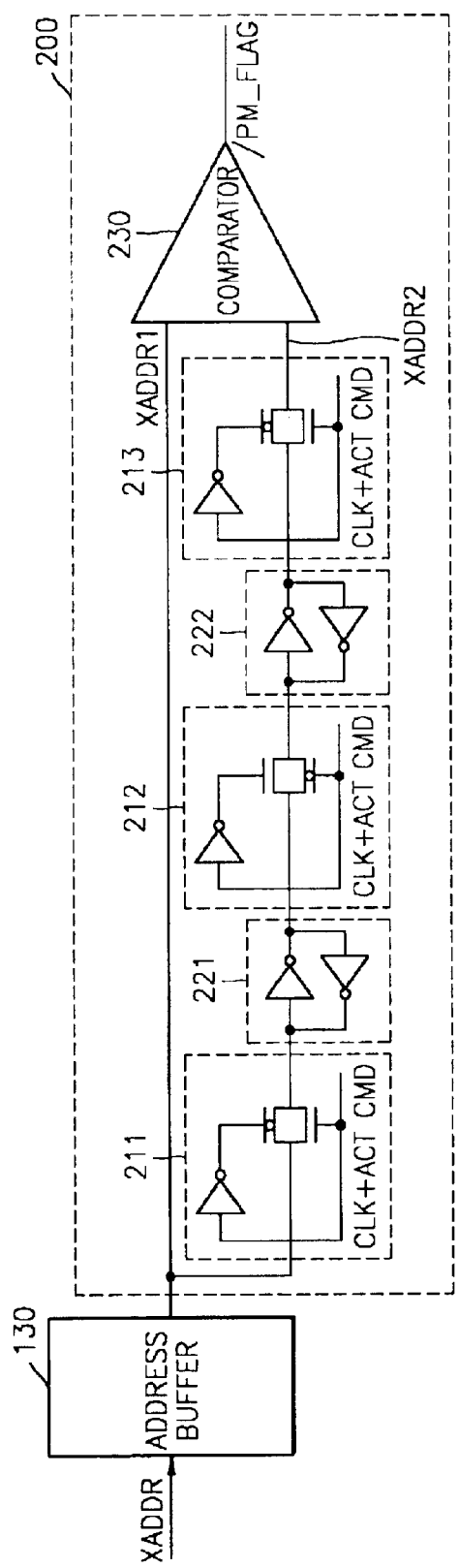
FIG. 7 is a circuit diagram illustrating a row address comparator according to an embodiment of the present invention, which is preferably implemented in the device of FIG. 3.

FIG. 7 is a circuit diagram illustrating a row address comparator (200) according to an embodiment of the present invention, which is preferably implemented in the device of FIG. 3. The row address comparator (200) comprises three switches (211, 212, 213), two latches (221 and 222), and a comparator (230). The first, second and third switches (211, 212, 213) each comprise transmission gates and inverters, and are turned on/off in response to a clock/active signal CLK+ACT CMD. The clock/active signal CLK+ACT CMD is a signal that is generated in response to a clock CLK signal and an active command ACT signal. More specifically, the first and third switches (211 and 213) are turned on in response to a clock/active signal CLK+ACT CMD having a logic "high" level, whereas the second switch (212) is turned on in response to a clock/active signal CLK+ACT CMD having a logic "low" level, as is readily understood by those of ordinary skill in the art. The first and second latches (221 and 222) each comprise a pair of inverters.

A row address XADDR input via the address buffer (130) is input to one terminal of the comparator (230) as row address XADDR1. At the same time, since the first switch (211) is turned on according to a clock/active signal CLK+ACT CMD having a logic "high" level, the row address XADDR is input to the first latch (221). The row address input to the first latch (221) is input to the second latch (222) in response to a clock/active signal CLK+ACT CMD having a logic "low" level. The row address input to the second latch (222) is then input to the other terminal of the comparator (230) in response to a clock/active signal CLK+ACT CMD having a logic "high" level. Here, the row address directly input to one terminal of the comparator (230) is a "current" row address XADDR1 and the row address input to the other terminal of the comparator (230) via the latches (221 and 222) is a "previous" row address XADDR2. As described above, the "current" row address XADDR1 is a presently input row address and a "previous" row address XADDR2 is a row address that was previously input.

The comparator (230) compares the current row address XADDR1 with the previous row address XADDR2 and enables the page mode flag signal /PM_FLAG (output a logic "low" level) when the row addresses XADDR1 and XADDR2 are the same and disables the page mode flag signal /PM_FLAG (outputs a logic "high" level) when the row addresses XADDR1 and XADDR2 are different.

Figure 8:
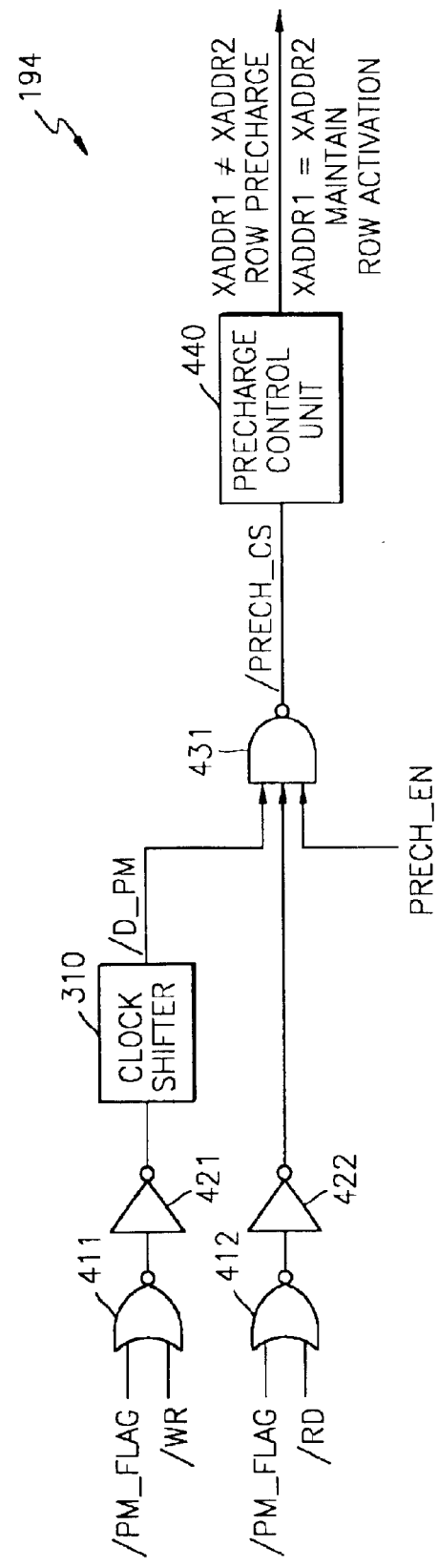
FIG. 8 is a circuit diagram illustrating a precharge control circuit according to an embodiment of the present invention, which is preferably implemented in the device of FIG. 3.

FIG. 8 is a circuit diagram illustrating a precharge control circuit according to an embodiment of the present invention, which is preferably implemented in the device of FIG. 3. In general, the precharge control circuit (194) receives as input a precharge enable signal (PRECH_EN) from the precharge control signal generation unit (154), the page mode flag signal (/PM_FLAG) output from the row address comparator (200) and the read command /RD and write command /WR signals. In a "page mode" operation where data is written to memory, the precharge control circuit (194) will delay the page mode flag signal (/PM_FLAG) by a predetermined time TD2 (i.e., generate delayed signal /D_PM) to account for the delay (TD1) in activation of the wordlines (as shown in FIG. 5). In the exemplary embodiment, the page mode flag signal (/PM_FLAG) is not delayed in a page mode operation where data is read from memory.

Referring to FIG. 8, the precharge control circuit (194) comprises NOR gates (411 and 412), inverters (421 and 422), a NAND gate (431), a clock shifter (310), and a precharge control unit (440). The NOR gate (411) and the inverter (421) effectively perform a logical "OR" operation of the page mode flag signal /PM_FLAG and the writing command signal /WR. The clock shifter (310) shifts the output of the inverter (421) by the second delay time TD2 (FIG. 5). In addition, the NOR gate (412) and the inverter (422) effectively perform a logical OR operation of the page mode flag /PM_FLAG and the reading command signal /RD. The output of the inverter (422) is input to the NAND gate (431) without being delayed.

In a page mode operation where data is written to memory, the page mode flag /PM_FLAG and writing command signal /WR are both enabled (logic low), and the reading command /RD is logic "high". As such the output of the inverter (422) is logic "high" and the output of the inverter (421) is logic "low". The output of the inverter (421) is delayed by the clock shifter (310) by a second delay time TD2. Therefore, in effect, the page mode flag signal /PM_FLAG (logic low enabled) is delayed by TD2 (the delayed page mode signal /D_PM is output from clock shifter (310)).

In a page mode operation where data is read from memory, the page mode flag signal /PM_FLAG and the reading command signal /RD are both enabled (logic low), and the writing command signal is disabled (logic high). Accordingly, the output of the inverter (421) will be a logic "high" level and the output of the inverter (422) will be a logic "low" level. Therefore, in effect, the page mode flag signal /PM_FLAG is not delayed in a page mode operation where data is read from memory.

The NAND gate (431) performs a logical NAND operation of the precharge enable signal PRECH_EN and the output signals of the clock shifter (310) and inverter (422), and outputs a precharge control signal IPRECH_CS. The precharge enable signal PRECH_EN is a signal that is automatically enabled (output as a logic "high" level from the precharge control signal generation unit (154)) after a predetermined amount of time elapses from the input of an active command ACT. For example, in the conventional method described above with reference to FIG. 2, a row precharge is automatically started after about three (3) cycles from the clock cycle when an active command ACT is applied. However, in a page mode operation for writing data to memory according to the invention when the page mode flag /PM_FLAG is enabled (logic low level), the precharge enable signal PRECH_EN is output after being delayed by the first delay time TD1 according to the delay of the delay command S_CMD, as shown in FIG. 6. In the conventional semiconductor memory device, the precharge occurs automatically when the precharge enable signal PRECH_EN is enabled.

The precharge control signal /PRECH_CS that is output from the NAND gate (431) is input to the precharge control unit (440). The precharge control unit (440) will perform a precharge operation only when the precharge control signal /PRECH_CS is enabled (having a logic "low" level). Therefore, when the output of either the clock shifter (310) or the inverter (422) is logic "low", the precharge control signal /PRECH_CS will be disabled (logic "high" level).

Figure 9:
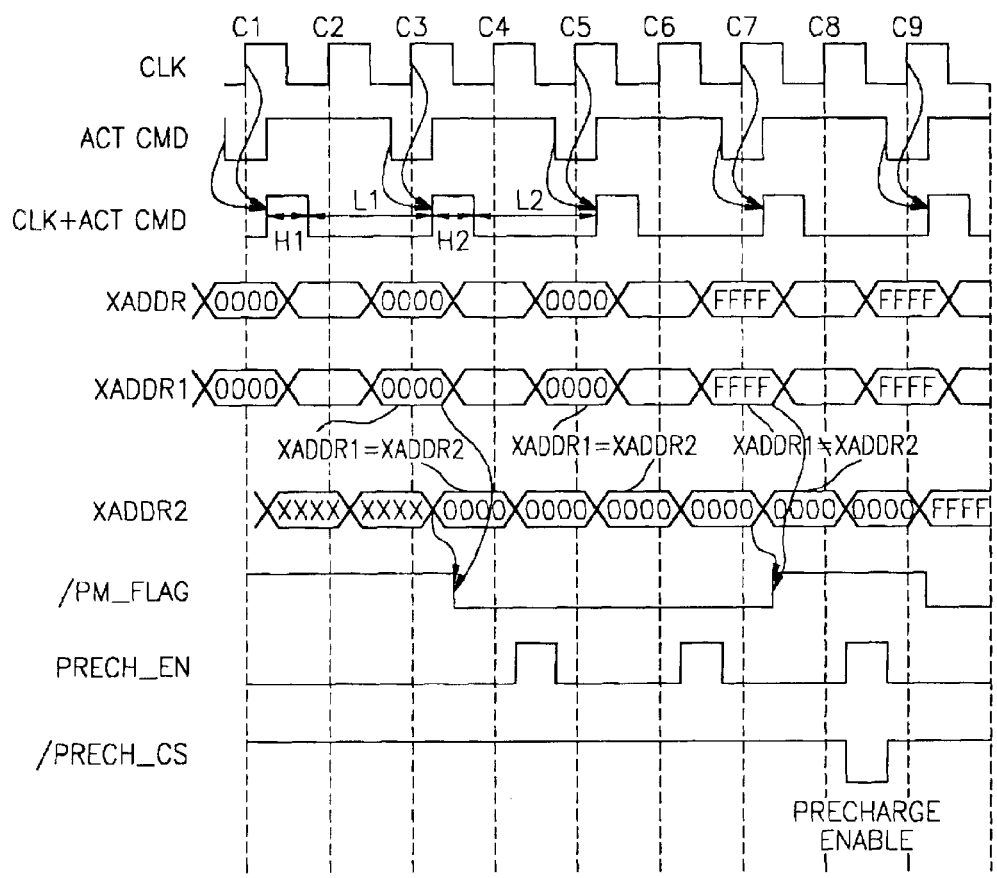
FIG. 9 is an exemplary timing diagram illustrating a mode of operation of the row address comparator and precharge control circuits of FIGS. 7 and 8.

Referring now to FIG. 9, an exemplary timing diagram illustrates a mode of operation of the row address comparator circuit (200) and the precharge control circuit (194) of FIGS. 7 and 8, respectively, during a page mode operation according to the present invention. In the example of FIG. 9, it is assumed that active commands ACT are activated at every odd clock cycles C1, C3, C5, C7, and C9. In addition, it is assumed that row addresses XADDR of '0000' are input with the first three active commands ACT and row addresses XADDR of 'FFFF' are input with the last two active commands ACT.

In response to a clock CLK and an active command ACT, a clock/active signal CLK+ACT CMD is enabled (logic high) for a predetermined amount of time, as shown in FIG. 9. Accordingly, in the exemplary timing diagram, the clock/active signal CLK+ACT CMD is enabled (logic high level) every two clock cycles. When an active command ACT is activated (logic low level), the row address signals XADDR are input. The first addresses XADDR1, which are directly input to one terminal of the comparator (230) are the same as the externally applied row addresses (from memory controller, for example). In practice, there may be a slight delay between the time when the row address XADDR is received and actually input XADDR1 to the terminal of the comparator (230).

In clock cycle C1, the first input row address XADDR1 of '0000' along with the first active command ACT is input to one terminal of the comparator (230). When the clock/active signal CLK+ACT CMD is enabled (logic high) for the period of time denoted by H1 in response to the first active command ACT, the first and third switches (211 and 213) are turned on. Accordingly, an address XXXX, which is stored in the second latch (222), is input to the other terminal of the comparator (230) as the previous address XADDR2. Here, the address stored in the second latch (222) is a predetermined initial address XXXX. At the same time, the current row address XADDR1 of '0000' is input to the first latch (221).

When the clock/active signal CLK+ACT CMD is disabled (logic low level) during the period of time denoted by L1, the first and third switches (211 and 213) are turned off and the second switch (212) is turned on. Thus, the first input row address 0000, which is stored in the first latch (221), is input to the second latch (222).

Then, a second active command ACT and a second input row address XADDR of '0000' are input at the clock cycle C3. When the clock/active signal CLK+ACT CMD is enabled (logic high) in response to the second active command ACT, the first and third switches (211 and 213) are turned on. Thus, the first input row address 0000, which is stored in the second latch (222), is input to the comparator (230) as the previous address XADDR2.

Here, since the current address XADDR1 (which was input with the second 5 active command ACT) and the previous address XADDR2 (which was input with the first active command ACT) are the same as '0000', the comparator (230) outputs the page mode flag /PM_FLAG of low level.

When the clock/active signal CLK+ACT CMD is disabled (logic low level) for the period denoted by L2, the second switch (212) is turned on so that the second input row address 0000, which is stored in the first latch (221), is input to the second latch (222). As a result, the first and second latches (221 and 222) store the previous row address that was input with the second active command ACT, and supply the previous address XADDR2 to the comparator (230) when the third active command ACT is input.

Then, the comparator (230) compares the previous address XADDR2 (which was input with the second active command ACT) with the current address XADDR1 (which was input with the third active command ACT). Since the previous input row address of '0000' and the third (current) input row address of '0000' are the same, the page mode flag /PM_FLAG remains enabled (maintains a logic "low" level).

However, since the fourth input row address of 'FFFF' (which is input with an active command in clock cycle C7) is different from the third input row address of '0000' (which was input with an active command in clock cycle C5), the page mode flag /PM_FLAG is disabled (logic high level). And since the fifth input row address of 'FFFF' (which is input with an active command in clock cycle C9) and the previous input row address of 'FFFF' (which was input with an active command in clock cycle C7) are the same, the page mode flag /PM_FLAG is enabled again (logic low level).

Moreover, as shown in FIG. 9, the precharge enable signal PRECH_EN is enabled (logic "high" level) for a predetermined amount of time after about three clock cycles from the input of each active command ACT. Thus, in the example of FIG. 9, the precharge enable signal PRECH_EN is enabled three times in response to the first through third active commands ACT. However, when the first and second precharge enable signals PRECH_EN are enabled (logic "high" level), the page mode flag /PM_FLAG is enabled (logic "low" level) and consequently, the precharge control signal /PRECH_CS is disabled (logic "high" level). With the precharge control signal /PRECH_CS disabled, the precharge control circuit (194) blocks the precharge operation.

When the third precharge enable signal PRECH_EN is enabled (logic "high" level), the page mode flag /PM_FLAG is disabled (logic "high" level) and consequently, the precharge control signal /PRECH_CS is enabled (logic "low" level). Accordingly, the precharge control circuit (194) enables the precharge operation.

In summary, in a memory access operation according to the present invention where a previous row address and a current row address are the same, a precharge operation is blocked, which provides an increase in the memory access speed when data is written/read to memory cells having the same row address. Advantageously, the exemplary circuits and methods described herein provide an efficient a page mode operation in a semiconductor memory device having a partial activation architecture. The circuits and methods described above enable the memory access speed to be increased for successive read or write operations for the same row address.

Figure 10:
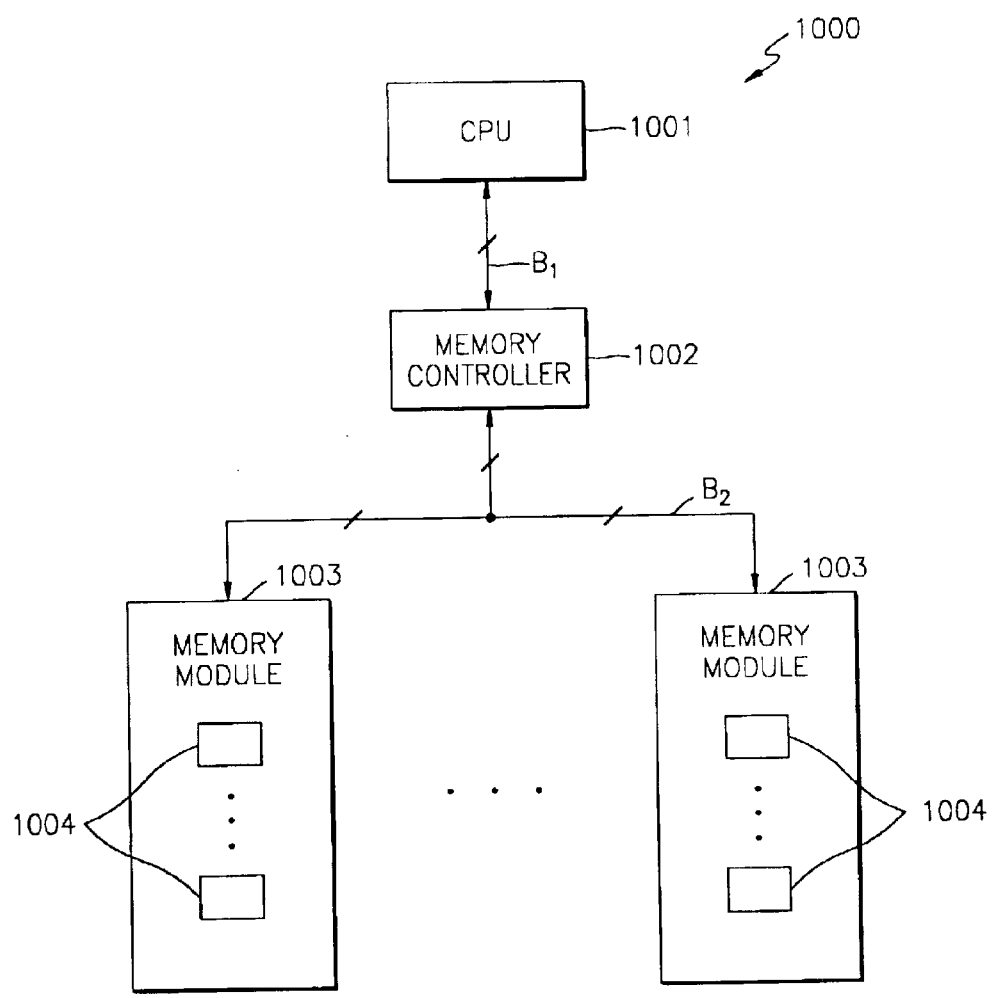
FIG. 10 is a schematic block diagram illustrating a memory system in which the present invention may be implemented.

FIG. 10 is a schematic block diagram illustrating a memory system in which the present invention may be implemented. The memory system (1000) comprises a CPU (1001), memory controller (1002) and a plurality of memory modules (1003). The CPU may be a microprocessor unit (MPU) or network processing unit (NPU), etc. Each memory module (1003) comprises a plurality of semiconductor memory devices (1004) such as FCRAMS. The CPU (1001) is connected to the memory controller by a first bus system (B1) (e.g., control bus, data bus, address bus) and the memory controller (1002) is connected the memory modules (1003) via a second bus system (B2) (control bus, data bus, address bus). In the exemplary framework of FIG. 10, the CPU (1001) controls the memory controller (1002) and the memory controller (1002) controls the memory (1003, 1004) (although it is to be understood that the CPU can be implemented to directly control the memory, without the use of a separate memory controller).

In the exemplary embodiment of FIG. 10, each memory module (1003) can represent, for example, a memory bank, and each memory device (1004) of a given memory module (1003) may be operated with the page mode operation of the present invention. In such case, each memory device (1004) can be logically divided into a plurality of column blocks to provide a partial activation framework, and then controlled as described above to provide a page mode operation. The control circuitry for performing page mode memory accesses is also located within the memory devices (1004).

In one preferred embodiment, the memory devices of one memory module may have an ×8 bit organization, while the memory devices of another memory module may have an ×16 bit organization. That is, different memory modules may be operated with different bit organizations.

A memory system according to another embodiment of the present invention may comprise one or more separate semiconductor memory devices (instead of the memory modules having a plurality of memory devices as shown in FIG. 10), and a central processing unit (and no memory controller). In this embodiment, the memory devices communicate directly with the central processing unit.

In yet another embodiment, a memory system according to the invention may comprise one or more separate semiconductor memory devices (instead of the memory modules having a plurality of memory devices as shown in FIG. 10) that directly communicate with a memory controller. In this embodiment, one memory device may have an ×8 bit organization, and another memory device may have an ×16 bit organization.

Although illustrative embodiments have been described herein with reference to the accompanying drawings, it is to be understood that the invention is not limited to the precise system and method embodiments described herein, and that various other changes and modifications may be affected therein by one skilled in the art without departing form the scope or spirit of the invention. All such changes and modifications are intended to be included within the scope of the invention as defined by the appended claims.

What is claimed is:

1. A method for accessing data in a memory device, comprising the steps of:

activating a first wordline corresponding to a first address to perform a data access operation;

receiving a second address after the first address; and if the second address is the same as the first address, generating a page mode enable signal for maintaining an activated state of the first wordline corresponding to the first address while activating a second wordline corresponding to the second address; and deactivating the first and second wordlines in response to disabling of the page mode enable signal.

2. The method of claim 1, wherein the step of generating a page mode enable signal comprises the steps of:

storing the first address;

comparing the second address to the first address using a comparator to determine if the first address and the second address are the same; and outputting the page mode enable signal from the comparator if the first address and the second address are the same.

3. The method of claim 1, wherein maintaining an activated state of the first wordline comprises preventing a precharge operation of the first wordline having the same address while the page mode enable signal is activated.

4. The method of claim 1, wherein the data access operation is a write operation, the method further comprising the steps of:

generating a write command signal; and delaying the write command signal by a predetermined first delay time.

5. The method of claim 4, further comprising the step of delaying the page mode enable signal by a predetermined second delay time to generate a delayed page mode enable signal.

6. The method of claim 5, wherein the delayed page mode enable signal prevents a precharge operation at least one time.

7. The method of claim 1, wherein the first address comprises a row address.

8. The method of claim 7, wherein the first address further comprises a column block selection address.

9. The method of claim 8, wherein the column block selection address comprises a column address or a row address.

10. A semiconductor memory device, comprising:

a memory cell array comprising a plurality of memory blocks;

a command decoder for decoding command signals and outputting decoded command signals to perform a data access operation;

an address comparator for comparing a first address corresponding to an activated first wordline to a second address received after the first address, and generating a page mode enable signal if the first address and the second address are the same; and a precharge control circuit for controlling a precharge operation, wherein the precharge control circuit is responsive to the page mode enable signal to prevent a precharge operation of the activated first wordline while a second wordline corresponding to the second address is activated to perform a data access operation.

11. The device of claim 10, wherein the address comparator comprises:

means for storing the first address;

means for comparing the second address to the first address to determine if the first and second address are the same; and means for outputting the page mode enable signal from the comparator if the first and second address are the same.

12. The device of claim 10, further comprising a command shifter circuit, operatively connected to an output of the command decoder and address comparator, wherein in response to the page mode enable signal output from the address comparator, the command shifter delays a write command signal output from the command decoder by a predetermined first delay time.

13. The device of claim 12, wherein the command shifter circuit comprises a clock shifter for delaying the write command signal, the clock shifter comprising a plurality of serially connected inverters.

14. The device of claim 12, wherein the command shifter circuit comprises a clock shifter for delaying the write command signal, the clock shifter comprising a plurality of serially connected flip-flops.

15. The device of claim 12, wherein in response to the write command signal, the precharge control circuit delays the page mode enable signal by a predetermined second delay time to generate a delayed page mode enable signal.

16. The device of claim 15, wherein the delayed page mode enable signal prevents a precharge operation of the activated first wordline.

17. The device of claim 10, wherein the memory cell array comprises a partial activation framework, wherein each memory block is individually addressable by a block address comprising at least two column addresses.

18. The device of claim 17, wherein the data access operation comprises a page mode operation where data is accessed for one or more memory cells having the same row address in a same memory block or in a different memory block.

19. The device of claim 18, wherein data is accessed using a burst mode.

20. A memory system, comprising:

a memory controller for generating a plurality of command and address signals; and a first memory module that receives the command and address signals, wherein the first memory module comprises a first memory device, the first memory device comprising:

a memory cell array logically divided into a plurality of memory blocks;

a command decoder for decoding the command signals and outputting decoded command signals to perform a data access operation;

an address comparator for comparing a first address corresponding to an activated first wordline to a second address received after the first address, and generating a page mode enable signal if the first address and the second address are the same; and a precharge control circuit for controlling a precharge operation, wherein the precharge control circuit is responsive to the page mode enable signal to prevent a precharge operation of the activated first wordline while a second wordline corresponding to the second address is activated to perform a data access operation.

21. The memory system of claim 20, wherein the memory system comprises a partial activation framework, wherein each memory block of the first memory device is individually addressable by a block address.

22. The memory system of claim 20, further comprising a second memory module comprising a second memory device, wherein the first memory device has a first bit organization and the second memory device has a second bit organization, wherein the first bit organization and the second bit organization are different.

23. A memory system, comprising:

a memory controller for generating a plurality of command and address signals; and a first memory device that receives the command and address signals, the first memory device comprising:

a memory cell array logically divided into a plurality of memory blocks;

a command decoder for decoding the command signals and outputting decoded command signals to perform a data access operation;

an address comparator for comparing a first address corresponding to an activated first wordline to a second address received after the first address, and generating a page mode enable signal if the first address and the second address are the same; and a precharge control circuit for controlling a precharge operation, wherein the precharge control circuit is responsive to the page mode enable signal to prevent a precharge operation of the activated first wordline while a second wordline corresponding to the second address is activated to perform a data access operation.

24. The memory system of claim 23, further comprising a second memory device, wherein the first memory device has a first bit organization and the second memory device has a second bit organization.

25. A memory system, comprising:

a central processing unit for generating a plurality of command and address signals; and a first memory module that receives the command and address signals, wherein the first memory module comprises a first memory device, the first memory device comprising:

a memory cell array logically divided into a plurality of memory blocks;

a command decoder for decoding the command signals and outputting decoded command signals to perform a data access operation;

an address comparator for comparing a first address corresponding to an activated first wordline to a second address received after the first address, and generating a page mode enable signal if the first address and the second address are the same; and a precharge control circuit for controlling a precharge operation, wherein the precharge control circuit is responsive to the page mode enable signal to prevent a precharge operation of the activated first wordline while a second wordline corresponding to the second address is activated to perform a data access operation.

26. The memory system of claim 25, further comprising a second memory module comprising a second memory device.

27. The memory system of claim 26, wherein the first memory device has a first bit organization and the second memory device has a second bit organization, wherein the first bit organization and the second bit organization are different.

28. The memory system of claim 25, wherein the central processing unit is a network processing unit (NPU).

29. A memory system, comprising:

a central processing unit for generating a plurality of command and address signals; and a first memory device that receives the command and address signals, wherein the first memory device has a first bit organization, the first memory device comprising:

a memory cell array logically divided into a plurality of memory blocks;

a command decoder for decoding the command signals and outputting decoded command signals to perform a data access operation;

an address comparator for comparing a first address corresponding to an activated first wordline to a second address received after the first address, and generating a page mode enable signal if the first address and the second address are the same; and a precharge control circuit for controlling a precharge operation, wherein the precharge control circuit is responsive to the page mode enable signal to prevent a precharge operation of the activated first wordline while a second wordline corresponding to the second address is activated to perform a data access operation.

30. The memory system of claim 29, further comprising a second memory device having a second bit organization, wherein the first bit organization and the second bit organization are different.

31. The memory system of claim 29, wherein the central processing unit is a network processing unit (NPU).

32. A method for accessing data in a memory device, the memory device comprising a memory array divided into a plurality of memory blocks, the method comprising the steps of:

(a) inputting a first row address and a first memory block selection address;

(b) selecting a first memory block in the memory array corresponding to the first memory block selection address and activating a first wordline of the selected first memory block corresponding to the first row address to perform a data access operation;

(c) inputting a second row address and a second memory block selection address;

(d) comparing the second row address with the first row address and generating a control signal to prevent precharge of the first wordline if the second row address and the first row address are the same, and selecting a second column block in the memory array corresponding to the second column block selection address and activating a second wordline of the selected second column block corresponding to the second row address;

(e) maintaining the control signal in an enabled state to prevent deactivation of previously activated wordlines having the same address starting from the first activated wordline, while each subsequent input row address is the same as a last input row address; and (f) disabling the control signal when a subsequent input row address is not the same as a last input row address to deactivate all previously activated wordlines having the same row address.

33. The method of claim 32, wherein the first and second selected memory blocks are the same.

34. The method of claim 32, wherein the step of inputting a first row address and a first memory block selection address comprises inputting a first active command synchronously with the first row address and the first memory block selection address in a first clock cycle, and the method further comprising the step of:

synchronously inputting a first data access command and a first column line address in a second clock cycle after the first clock cycle; and synchronously inputting a second active command with the second row address and the second memory block selection address in a third clock cycle after the second clock cycle.

35. The method of claim 34, wherein the first data access command is a write command, and wherein the method further comprises the steps of:

delaying the write command for a first predetermined period of time to delay activation of the first wordline corresponding to the first row address, to enable precharge of a previously activated wordline having an address that is different from the first row address.

36. The method of claim 35, further comprising the step of delaying output of the control signal by a predetermined time to account for the delayed activation of the first wordline.

* * * * *